(12) United States Patent
Sambucco

(10) Patent No.: US 9,667,243 B2
(45) Date of Patent: May 30, 2017

(54) HIGH SPEED TRACKING CURRENT SENSE SYSTEM

(71) Applicant: Infineon Technologies Austria AG, Villach (AT)

(72) Inventor: Adriano Sambucco, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/851,879

(22) Filed: Sep. 11, 2015

(65) Prior Publication Data

US 2017/0077923 A1    Mar. 16, 2017

(51) Int. Cl.
*H03K 5/153* (2006.01)
*H03K 17/687* (2006.01)
*G01R 19/00* (2006.01)

(52) U.S. Cl.
CPC ....... *H03K 17/687* (2013.01); *G01R 19/0092* (2013.01)

(58) Field of Classification Search
CPC ........ H03K 5/2481; H03K 5/249; H03K 5/08; H03K 5/24; G01R 19/16519
USPC .......................................... 327/77, 108, 109
See application file for complete search history.

(56) References Cited

U.S. PATENT DOCUMENTS

| | | | | |
|---|---|---|---|---|
| 2002/0093366 | A1* | 7/2002 | Fotouhi | 327/108 |
| 2010/0277142 | A1* | 11/2010 | Tan et al. | 323/268 |
| 2014/0320095 | A1* | 10/2014 | Sambucco | 323/271 |

FOREIGN PATENT DOCUMENTS

DE    10223977 C1 *    9/2003

OTHER PUBLICATIONS

Shin et al., "Bridgeless Isolated PFC Rectifier Using Bidirectional Switch and Dual Output Windings," IEEE Energy Conversion Congress and Exposition (ECCE), Sep. 17-22, 2011, pp. 2879-2884.
U.S. Appl. No. 14/206,816, by Adriano Sambucco, filed Mar. 12, 2014.
U.S. Appl. No. 14/528,772, by Adriano Sambucco et al., filed Oct. 30, 2014.
U.S. Appl. No. 14/528,819, by Adriano Sambucco et al., filed Oct. 30, 2014.

* cited by examiner

*Primary Examiner* — Quan Tra
(74) *Attorney, Agent, or Firm* — Shumaker & Sieffert, P.A.

(57) ABSTRACT

A tracking current sensing system is described. The system may include a first electrical sensing element configured to receive a first electrical signal and a second electrical signal from a high side switch of a half-bridge circuit and output an electrical signal based on the received electrical signals. The system may also include a second electrical sensing element configured to receive a first electrical signal and a second electrical signal from a low side switch of the half-bridge circuit and output an electrical signal based on the received electrical signals. The system may further include a current evaluation circuit that is configured to receive the electrical signal output by the first electrical sensing element and the second electrical sensing element, and output a bias output current that is continuous when the half-bridge switches between the high side switch and the low side switch.

20 Claims, 4 Drawing Sheets

HIGH SPEED TRACKING CURRENT SENSE SYSTEM

TECHNICAL FIELD

This disclosure is generally related to current sensing techniques in electronic circuitry.

BACKGROUND

A tracking current sense circuit typically provides a tracking current and may be used in applications such as DC-DC converters for server and mobile computer applications. Conventional linear tracking current sense systems often include an operational amplifier which results in a long settling time that limits the maximum frequency of the system. Conventional non-linear tracking current sense systems have inaccuracies and thus may not be suitable for some applications.

SUMMARY

In general, this disclosure describes techniques and circuits for improving the speed, bandwidth, and stability of tracking current sense systems. Some of the techniques and circuits described herein utilize a common circuit regardless of which side of a half bridge is active, which may enable a tracking current sense system to maintain a continuous bias current when switching the active side of a half bridge. In this manner, the settling time that occurs when a side of the half bridge is activated may be eliminated. In addition, the current consumption of the tracking current sense system may be reduced. Further, the area and complexity of the tracking current sense system may be reduced.

In some examples, the techniques of the disclosure are directed to a tracking current sense system that may include a first electrical sensing element, a second electrical sensing element, and a tracking current sense system. The first electrical sensing element may be configured to receive a first electrical signal from a high side switch of a half-bridge circuit, receive a second electrical signal from the high side switch, and output an electrical signal based on the received first electrical signal and received second electrical signal. The second electrical sensing element may be configured to receive a first electrical signal from a low side switch of the half-bridge circuit, receive a second electrical signal from the low side switch, and output an electrical signal based on the received first electrical signal and received second electrical signal. The current evaluation circuit may be electrically coupled to the first electrical sensing element and the second electrical sensing element. The current evaluation circuit may be configured to receive the electrical signal output by the first electrical sensing element and the second electrical sensing element, and output a bias output current that is continuous when the half-bridge switches between the high side switch and the low side switch.

In some examples, the techniques of the disclosure are directed a method that may include receiving, by a first electrical sensing element and from a high side switch of a half-bridge circuit, a first electrical signal and a second electrical signal, and outputting, by the first electrical sensing element, an electrical signal based on the received first electrical signal and received second electrical signal. The method may also include receiving, by a second electrical sensing element and from a low side switch of a half-bridge circuit, a first electrical signal and a second electrical signal, and outputting, by the second electrical sensing element, an electrical signal based on the received first electrical signal and received second electrical signal. Further, the method may include receiving, by a current evaluation circuit, the electrical signal output by the first electrical sensing element and the electrical signal output by the second electrical sensing element, and outputting, by the current evaluation circuit, a bias output current that is continuous when the half-bridge switches between the high side switch and the low side switch.

In some examples, the techniques of the disclosure are directed to a system that may include a half bridge circuit, a first electrical sensing element, a second electrical sensing element, and a current evaluation circuit. The half-bridge circuit may include a high side switch and a low side switch. The first electrical sensing element may be configured to receive a first electrical signal from the high side switch, receive a second electrical signal from the high side switch, and output an electrical signal based on the received first electrical signal and received second electrical signal. The second electrical sensing element may be configured to receive a first electrical signal from the low side switch, receive a second electrical signal from the low side switch, and output an electrical signal based on the received first electrical signal and received second electrical signal. The current evaluation circuit may be electrically coupled to the first electrical sensing element and the second electrical sensing element. The current evaluation circuit may be configured to receive the electrical signal output by the first electrical sensing element and the second sensing element, and output a bias output current that is continuous when the half-bridge switches between the high side switch and the low side switch.

The details of one or more examples and techniques of this disclosure are set forth in the accompanying drawings and the description below. Other features, objects, and advantages of the disclosure will be apparent from the description and drawings, and from the claims.

BRIEF DESCRIPTION OF DRAWINGS

The drawings are not necessarily drawn to scale. Like reference numbers indicate like features, although variations between like features may exist in the various examples.

DETAILED DESCRIPTION

Figure 1:
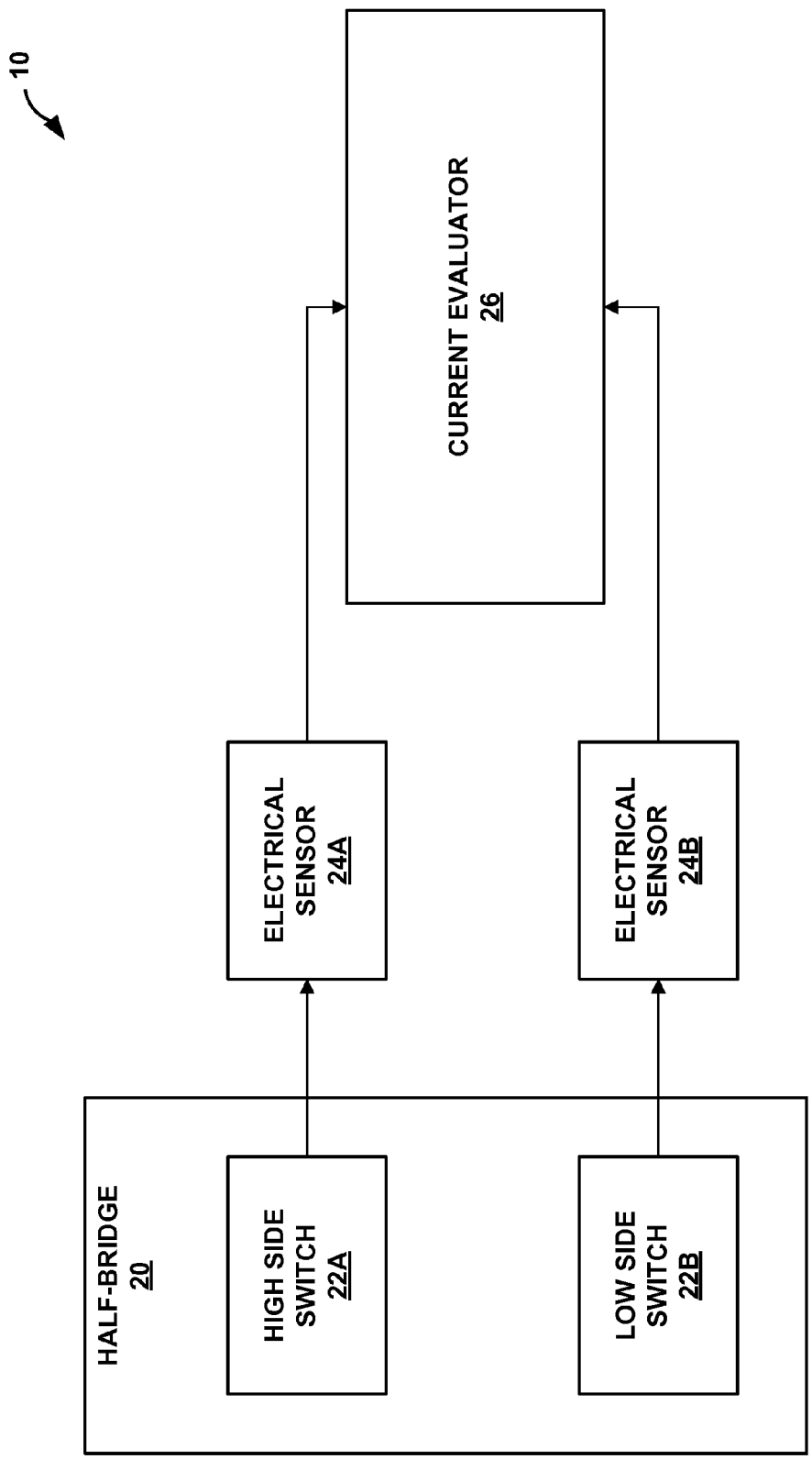
FIG. 1 is a schematic diagram illustrating an example tracking current sense system, in accordance with one or more techniques described in this disclosure.

FIG. 1 is a schematic diagram illustrating an example tracking current sense system, in accordance with one or more techniques described in this disclosure. Tracking current sense system 10 includes half-bridge 20, electrical sensing elements 24A, 24B (collectively "electrical sensing elements 24"), and current evaluation circuit 26. FIG. 1 shows tracking current sense system 10 as having three separate and distinct components, however system 10 may include additional or fewer components. For instance, half-bridge 20, electrical sensing elements 24, and current evaluation circuit 26 may be three individual components or may represent a combination of one or more components that provide the functionality of tracking current sense system 10 as described herein.

Tracking current sense system 10 includes half-bridge 20, which includes a high side switch 22A and a low side switch 22B (collectively "switches 22"). Switches 22 may include transistor based switches (e.g., MOSFET, IGBT, etc.), gallium nitride (GaN) based switches, or other types of switch devices. Each switch 22 may include multiple switching devices (e.g., transistors). Each switch 22 may output one or more electrical signals to a respective electrical sensing element 24. For example, each switch 22 may include a first switching device that outputs a first electrical signal (e.g., current or voltage) and a second switching device that outputs a second electrical signal. In some examples, the first electrical signal is indicative of the current in half-bridge 20 and the second electrical signal includes a mirror or tracking signal proportional to the first electrical signal.

Figure 2:
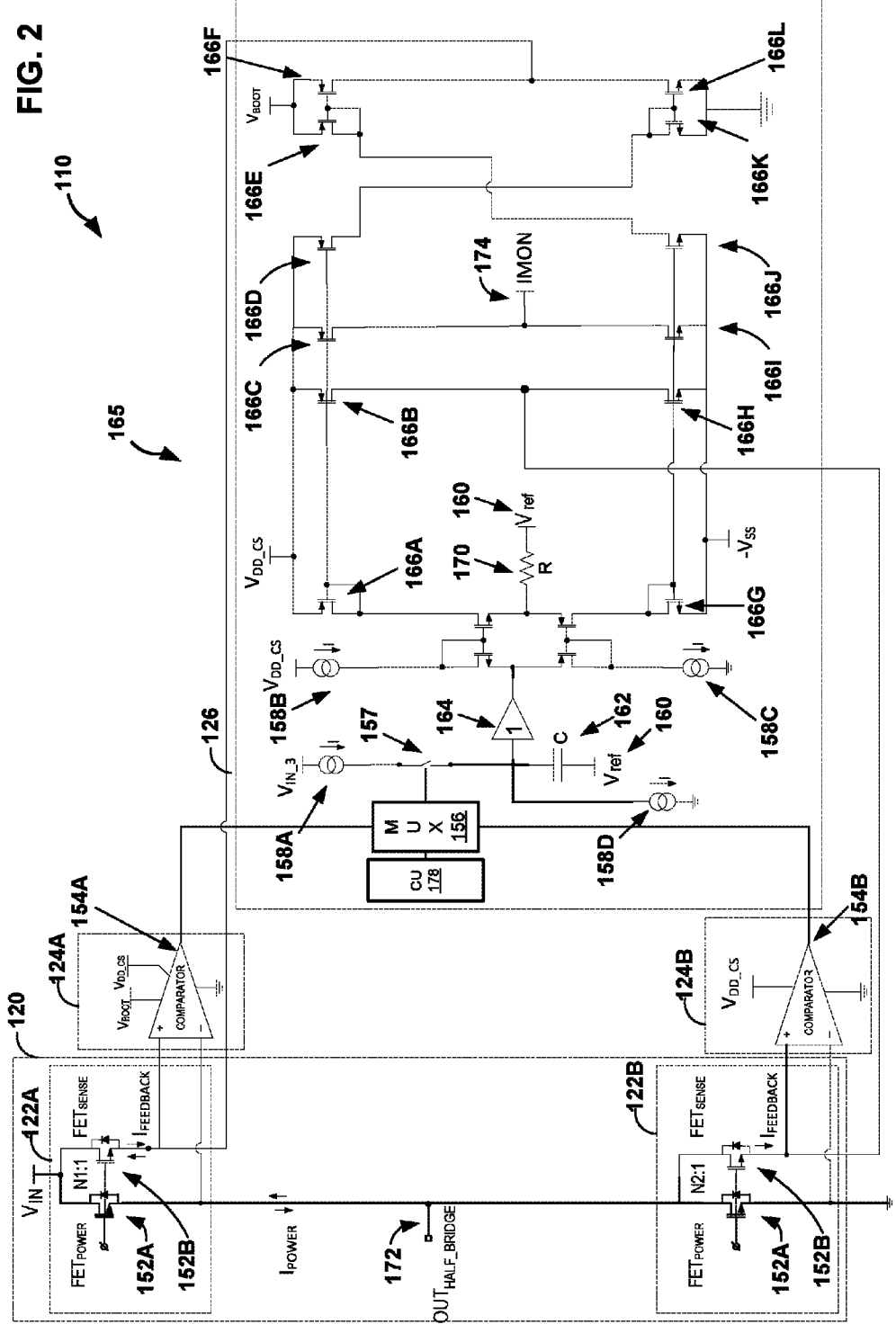
FIG. 2 is a schematic diagram illustrating an example tracking current sense system, in accordance with one or more techniques described in this disclosure.
Figure 3:
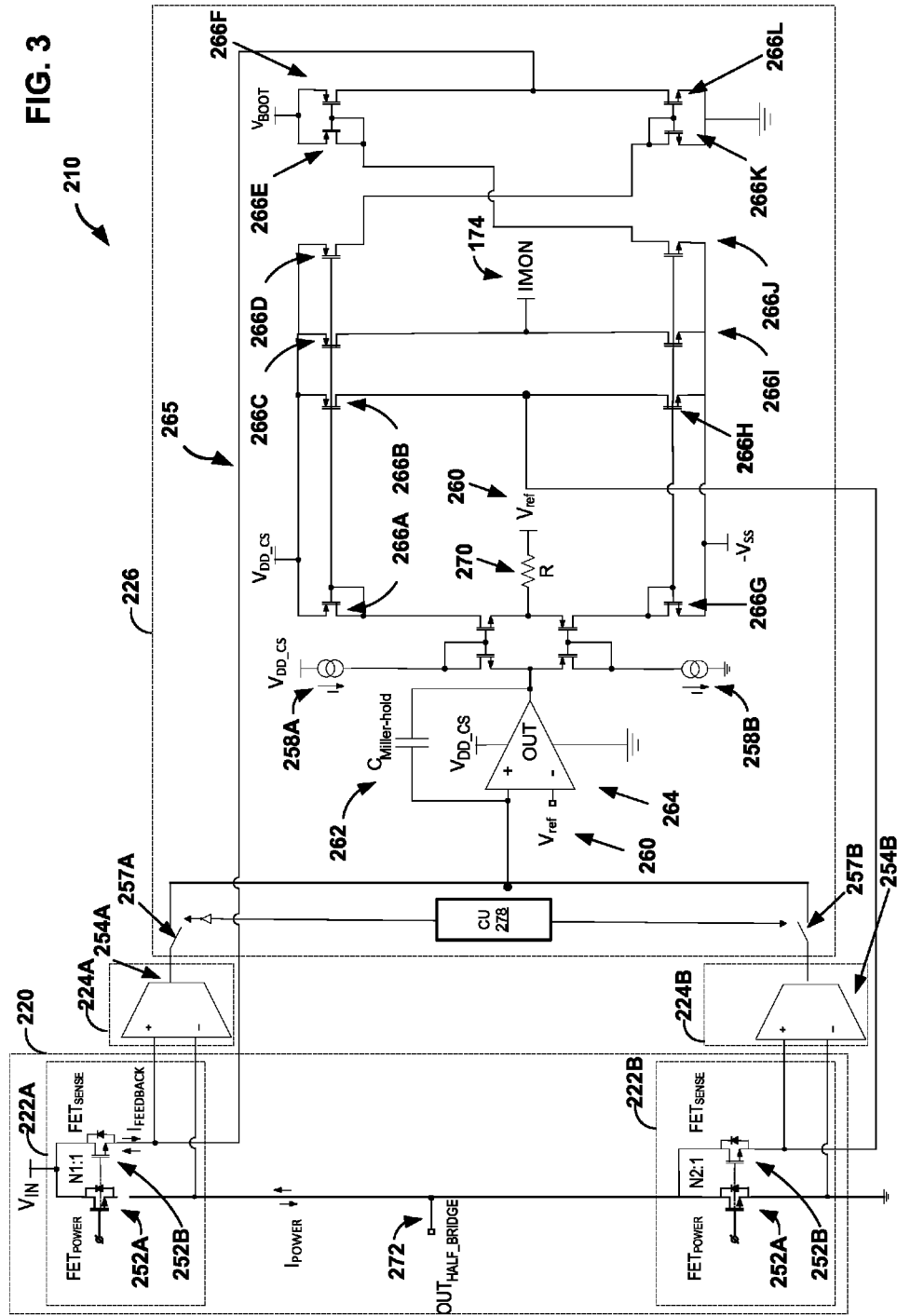
FIG. 3 is a schematic diagram illustrating an example tracking current sense system, in accordance with one or more techniques described in this disclosure.

Each of the electrical sensing elements 24 may be configured to receive a plurality of electrical signals from a respective switch 22 and output a signal based on the received signals. The electrical signals received by switches 22 may be indicative of the current in half-bridge 20. For example, electrical sensing element 24A may receive a plurality of electrical signals from high-side switch 22A and output an electrical signal based on the plurality of received signals. Likewise, electrical sensing element 24B may receive a plurality of electrical signals from low-side switch 22B and output an electrical signal based on the plurality of received signals. In some examples, the electrical signals received by electrical sensing elements 24 may include voltages or currents and the electrical signal output by each electrical sensing element 24 may include a voltage or current. As illustrated in FIG. 2, in some examples, electrical sensing elements 24 may include comparators. For example, each comparator 24 receives a first voltage and a second voltage from a respective switch 22 and outputs a voltage based on a comparison of the first and second received voltages. In some examples, as illustrated in FIG. 3, electrical sensing elements 24 may include operational transconductance amplifiers (OTAs). For example, each OTA 24 receives a first voltage and a second voltage from a respective switch 22 and outputs a current based on the first and second received voltages. In some examples, electrical sensing elements 24 may include current mode amplifiers, such that the inputs received by each electrical sensing element 24 include currents and the output from each electrical sensing element 24 includes a voltage. In some examples, electrical sensing elements 24 may include operational current amplifiers, such that the inputs received by each electrical sensing element 24 include currents and the output from each electrical sensing element 24 includes a current.

Current evaluation circuit 26 includes electrical circuitry to output a bias current that is proportional to the current in half-bridge 20. Current evaluation circuit 26 may receive the electrical signal output by each of electrical sensing elements 24. Current evaluation circuit 26 may output the bias current based on the electrical signals received from electrical signals 24. In some examples, current evaluation circuit 26 includes a first set of circuit elements for biasing the high side switch 22A and a second set of circuit elements for biasing low side switch 22B. However, in some examples, current evaluation circuit 26 includes common circuitry to bias high side switch 22A and low side switch 22B. For example, as illustrated in more detail in FIGS. 2 and 3, current evaluation circuit 26 may include a capacitor, current generator, resistor, and reference voltage which may be used when high side switch 22A is active and when low side switch 22B is active. In other words, the same capacitor, current generator, resistor, and reference voltage may be used to provide a bias output current to the inactive switch 22 regardless of which switch 22 is active. The capacitor may maintain a continuous bias current in the current evaluation circuit when tracking current sense system 10 switches between high side switch 22A and low side switch 22B, which may eliminate the settling time required when switching conventional half-bridge devices. In addition, by using common circuitry, current evaluation circuit 26 may reduce the number of circuit elements present, which may reduce the area, cost, and complexity of the circuit. Further, the current consumed by tracking current sense system 10 may be reduced.

FIG. 2 is a schematic diagram illustrating an example tracking current sense system, in accordance with one or more techniques described in this disclosure. In some examples, the tracking current sense system includes a non-linear tracking current sense system 110. Tracking current sense system 110 includes half-bridge 120, electrical sensing elements 124A, 124B (collectively "electrical sensing elements 124"), and current evaluation circuit 126, which correspond to elements 20, 24, and 26 of FIG. 1, respectively. In general, tracking current sense system 110 performs current sensing techniques to conduct a replica or "tracking" current from which tracking current sense system 110 can sense the level of current in the half-bridge 120.

Half-bridge 120 includes a high side switch 122A and a low side switch 122B (collectively "switches 122"). In some examples, each switch 122 includes a plurality of transistors. For example, as illustrated in FIG. 2, high side switch 122A and low side switch 122B each include two transistors: $FET_{POWER}$ transistor 152A and $FET_{SENSE}$ transistor 152B (collectively "transistors 152"). $FET_{POWER}$ transistor 152A receives a voltage from a first source and $FET_{SENSE}$ transistor 152B receives a voltage from a second source. While transistors 152 are described as FETs, transistors 152 may include MOSFET switches, IGBT switches, or similar switching devices. In some examples, transistors 152A and 152B are the same size. However, in some examples, transistors 152A and 152B are different sizes. For example, $FET_{SENSE}$ transistor 152B may be a fraction N of $FET_{POWER}$ transistor 152A $$\left(\text{i.e., } FET_{SENSE} = \frac{FET_{POWER}}{N}\right).$$

For a given switch 122 (e.g., high side switch 122A), transistors 152 may be controlled with the same gate signal. For example, when transistor 152A of high side switch 122A is turned on, transistor 152B of high side switch 122A is also turned on. Transistor 152A conducts current $I_{POWER}$. Transistor 152B conducts a feedback current $I_{FEEDBACK}$. As used throughout this disclosure, the terms "feedback current", $I_{FEEDBACK}$, tracking current, and replica current, are all used interchangeably to generally describe a current that proportionately mirrors the level of current flowing out of a power transistor (e.g., $FET_{POWER}$ transistor 152A). In general the term "feedback current" of $I_{FEEDBACK}$ is used for the current that flows in a sense transistor (e.g., $FET_{SENSE}$ transistor 152B). In other words, each switch 122 includes a current $I_{POWER}$ via $FET_{POWER}$ transistor 152A and a mirror current $I_{FEEDBACK}$ via $FET_{SENSE}$ transistor 152B.

Switches 122 may be used to power a load (e.g., an inductive load) that is coupled to a switching node of a half-bridge (e.g., at node $OUT_{HALF\_BRIDGE}$ 172). Tracking current sense system 110 may turn $FET_{POWER}$ transistor 152A of a given switch 122 (e.g., high side switch 122A) on and off to control the voltage or current at node $OUT_{HALF\_BRIDGE}$ 172. For example, tracking current sense system 110 may rely on the control of high side switch 122A $FET_{POWER}$ transistor 152A to produce a PWM output signal at node $OUT_{HALF\_BRIDGE}$ 172. A gate signal causes $FET_{POWER}$ transistor 152A to turn on and off. Likewise, the same gate signal may simultaneously drive $FET_{SENSE}$ transistor 152B of the same switch 122 into the same operating state (e.g., on or off) as transistor 152A to conduct $I_{FEEDBACK}$. Tracking current sense system 110 may rely on $I_{FEEDBACK}$ to sense or otherwise determine the amount of current $I_{POWER}$ coming out of transistor 152A. Switches 122A, 122B are electrically coupled to a respective electrical sensing element 124A, 124B.

In the example of FIG. 2, each electrical sensing element 124 receives a plurality of input electrical signals and an outputs an electrical signal. For example, each electrical sensing element 124 may receive two input electrical signals and output one electrical signal. In some examples, electrical sensing elements 124A, 124B includes a respective comparator 154A, 154B (collectively "comparators 154"). Each comparator 154 receives two input voltages and outputs an output voltage based on a comparison of the input voltages. For example, as illustrated in FIG. 2, each comparator 154 receives a first input voltage from the source of $FET_{SENSE}$ transistor 152B at a first terminal (e.g., a positive "plus" pin) and receives a second input voltage from the source of $FET_{POWER}$ transistor 152B at a second terminal (e.g., a negative "minus" pin). Each comparator 154 may compare the first input voltage and the second input voltage, and output a voltage based on the comparison of the first input voltage and the second input voltage.

Current evaluation circuit 126 may include common circuitry to bias high side switch 122A and low side switch 122B. As a result, the current in current evaluation circuit 126 may remain constant when switching between high side switch 122A and low side switch 122B, such that the settling time may be eliminated. In some examples, current evaluation circuit 26 includes a control unit ("CU") 178, multiplexor ("MUX") 156, switch 157, one or more current generators 158A-158D (collectively "current generators 158"), resistor 170, reference voltage $V_{REF}$ 160, and an AB class output stage 165.

Current evaluation circuit 126 may determine the current output by half-bridge 120 based on the electrical signals output by the respective electrical sensing elements 154. MUX 156 may receive a control signal from control unit 178 and the electrical signals (e.g., voltage) output by each electrical sensing element (e.g., comparator) 154. In some examples, control unit 178 includes a pulse width modulator (PWM), pulse density modulator (PDM), or pulse frequency modulator (PFM). MUX 156 multiplexes the signals received from control unit 178 and each comparator 154 in order to control switch 157. For example, when the voltage received by comparator 154 at the plus pin (i.e., the first input voltage) is higher than the voltage at the minus pin (i.e., the second input voltage), comparator 154 may cause switch 157 to close or operate in an "on-state". When switch 157 is closed, current generator 158A supplies current to capacitor 162, thus charging capacitor 162. When the voltage at the plus pin of comparator 154 is lower than the voltage at the minus pin, comparator 154 may cause switch 157 to open or operate in an "off-state", thus discharging capacitor 162.

AB class output stage 165 includes a plurality of transistors 166A-166L (collectively "transistors 166") and outputs a bias current via node IMON 174. In some examples, AB class output stage 165 is coupled directly to capacitor 162. In some examples, as illustrated in FIG. 2, current evaluation circuit includes a buffer 164 coupled between capacitor 162 and AB class output stage 165. AB class output stage 165 is coupled to resistor 170, which is coupled to reference voltage $V_{REF}$ 160. The current through resistor 170 is based on reference voltage $V_{REF}$ 160 and the status of switch 162 (i.e., whether switch 162 is open or closed).

In operation, tracking current sense system 110 includes a $T_{ON}$ cycle and a $T_{OFF}$ cycle. As used throughout the disclosure, a $T_{ON}$ cycle of a transistor is generally defined as a period of time when the transistor is closed, conducting current through its conduction channel, or otherwise operating in an on-state. The $T_{OFF}$ cycle of the transistor represents the time when the transistor is open, not conducting through its conduction channel, or otherwise operating in an off-state. For example, $T_{ON}$ of transistors 152 represent the period of time when transistors 152 are closed or otherwise operating in an on-state rather than being open or otherwise operating in an off-state. With reference to a half-bridge configuration, the term $T_{ON}$ cycle of the half-bridge is generally used to describe the period of time when the high side switch of the half-bridge is closed or otherwise operating in an on-state and the low side switch of the half-bridge is open or otherwise operating in an off-state. With further reference to a half-bridge configuration, the term $T_{OFF}$ cycle of a half-bridge is generally used to describe the period of time when the high side switch of the half-bridge is open or otherwise operating in an off-state and the low side switch of the half-bridge is closed or otherwise operating in an on-state.

During the $T_{ON}$ cycle, high side switch 122A operates in an on-state (at which point, low side switch 122B is in an off-state) and switch 157 operates based on the voltages received by comparator 154A from high side switch 122A. If the voltage of the $FET_{SENSE}$ transistor 152B is higher than the voltage of $FET_{POWER}$ transistor 152A, the output of comparator 154A is high and switch 157 will be closed. Current generator 158A generates a current that flows to capacitor 162 when switch 157 is closed. Thus, capacitor 162 is charged by current generator 158A and the current across resistor 170 increases. As a result, AB class output stage 165 mirrors a higher current that pulls down the source of the high side $FET_{SENSE}$ transistor 152B and increases the current flowing out of IMON 174. Thus, current evaluation circuit 126 outputs a bias current via IMON 174 that mirrors the current in half-bridge 120. However, if the voltage of the $FET_{SENSE}$ transistor 152B is lower than the voltage of $FET_{POWER}$ transistor 152A, the output of comparator 154A is low and switch 157 will be open. Thus, capacitor 162 discharges and current across resistor 170 decreases. As a result, AB class output stage 165 decreases the bias current output via IMON 174.

During the $T_{OFF}$ cycle, low side switch 122B operates in an on-state (at which point, high side switch 122A is in the off-state) and switch 157 operates based on the voltages received by comparator 154B from low side switch 122B. Switch 157 operates according to the same principles described above with reference to the $T_{ON}$ cycle. Thus, current evaluation circuit 126 uses the common circuitry (switch 157, current generator 158A, capacitor 162, and resistor 170) to output a bias current via IMON 174 during $T_{OFF}$ and during $T_{ON}$.

Since current evaluation circuit 126 uses common circuitry to output the bias current during $T_{ON}$ and $T_{OFF}$, capacitor 162 may sink or supply voltage or current as necessary to maintain a continuous bias output current when tracking current sense system 110 switches between high side switch 122A and low side switch 122B. As a result, the settling time may be reduced or eliminated. Further, tracking current sense system 110 may track positive and negative currents without any discontinuities. If the current in half-bridge 120 is positive (flowing out of $OUT_{HALF\_BRIDGE}$ 172), the end of resistor 170 connected to AB class output stage 165 is higher than reference voltage $V_{REF}$ 160 and current will flow in to resistor 170. However, if the current in half-bridge 120 is negative (flowing in to $OUT_{HALF\_BRIDGE}$ 172), the end of resistor 170 connected to AB class output stage 165 is lower than reference voltage $V_{REF}$ 160 and current will flow out of resistor 170.

FIG. 3 is a schematic diagram illustrating an example tracking current sense system, in accordance with one or more techniques described in this disclosure. In some examples, the tracking current sense system includes a linear tracking current sense system 210. Tracking current sense system 210 includes half-bridge 220, electrical sensing elements 224A, 224B (collectively "electrical sensing elements 224"), and current evaluation circuit 226, which correspond to elements 20, 24, and 26 of FIG. 1, respectively. In general, tracking current sense system 210 performs current sensing techniques to conduct a replica or "tracking" current from which tracking current sense system 210 can sense the level of current in the half-bridge 220.

Half-bridge 220 is substantially similar to half-bridge 120 described with reference to FIG. 2. For example, half-bridge 220 includes a high side switch 222A (corresponding to high side switch 122A) and a low side switch 222B (corresponding to low side switch 122B). Switches 222A, 22B are collectively referred to as switches 222. In some examples, each switch 222 includes a plurality of transistors. For example, as illustrated in FIG. 3, high side switch 222A and low side switch 222B each include two transistors: $FET_{POWER}$ transistor 252A and $FET_{SENSE}$ transistor 252B (collectively "transistors 252"). Switches 222A, 222B are electrically coupled to a respective electrical sensing element 224A, 224B.

Each electrical sensing element 224 receives a plurality of input electrical signals and an outputs an electrical signal. In some examples, as illustrated in FIG. 3, electrical sensing elements 224A, 224B include a respective operational transconductance amplifier (OTA) 254A, 254B (collectively "OTAs 254"). Each OTA 254 may receive two input voltages and may output an output current based on a comparison of the input voltages. For example, as illustrated in FIG. 3, each OTA 254 receives a first input voltage from the source of $FET_{SENSE}$ transistor 252B at a first terminal (e.g., a positive "plus" pin) and receives a second input voltage from the source of $FET_{POWER}$ transistor 252B at a second terminal (e.g., a negative "minus" pin). Each OTA 254 may compare the first input voltage and the second input current, and output a current based on the comparison of the first input voltage and the second input voltage.

Current evaluation circuit 226 may include common circuitry to bias high side switch 222A and low side switch 222B. As a result, the bias current in current evaluation circuit 226 may remain constant when switching between high side switch 222A and low side switch 222B, such that the settling time may be eliminated. In some examples, current evaluation circuit 26 includes a control unit ("CU") 278, current generator 258A, resistor 270, reference voltage $V_{REF}$ 260, and an AB class output stage 265. In some examples, control unit 278 includes a pulse width modulator (PWM), pulse density modulator (PDM), or pulse frequency modulator (PFM). Control unit 278 may output a signal to control (open or close) switches 257A and 257B.

Current evaluation circuit 226 may determine the current output by half-bridge 220 based on the electrical signals output by the respective electrical sensing elements 254. For example, control unit 278 may output a PWM signal to close switch 257A when high side switch 222A is active. When switch 257A is closed, current may flow from OTA 254A to capacitor $C_{MILLER-HOLD}$ 262 and resistor 270.

Current evaluation circuit 226 includes AB class output stage 265, which includes a plurality of transistors 266A-266L (collectively "transistors 266") and outputs a bias current via node IMON 274. In some examples, AB class output stage 265 is coupled to capacitor 262 and resistor 270, which is coupled to reference voltage $V_{REF}$ 260. The current through resistor 270 is based on reference voltage $V_{REF}$ 260 and the current output by OTAs 254A, 254B.

In operation, tracking current sense system 210 includes a $T_{ON}$ cycle and a $T_{OFF}$ cycle. During the $T_{ON}$ cycle, high side switch 222A operates in an on-state (low side switch 222B is in the off-state) and control unit 278 causes switch 257A to close (switch 257B is open). Thus, current flows from OTA 254A to gain stage 264, capacitor $C_{MILLER-HOLD}$ 262, and current generator 258A. If the source of the $FET_{SENSE}$ transistor 252B is lower than the source of $FET_{POWER}$ transistor 252A, tracking current sense system 210 decreases the current across resistor 270. As a result, AB class output stage 265 mirrors a lower current that increases the voltage source of the high side $FET_{SENSE}$ transistor 252B.

Likewise, during the $T_{OFF}$ cycle, low side switch 222B operates in an on-state (high side switch 222A is in the off-state) and control unit 278 causes switch 257B to close (switch 257A is open). Current evaluation circuit 226 may adjust the current across resistor 270 using the same gain stage 264, capacitor $C_{MILLER-HOLD}$ 262, and current generator 258A used during the $T_{ON}$ cycle. Thus, current evaluation circuit 226 uses the common circuitry to update the bias current via IMON 274 during $T_{OFF}$ and during $T_{ON}$. By using common circuitry, tracking current sense system 210 may maintain a continuous bias current when switching between high side switch 222A and low side switch 222B.

Figure 4:
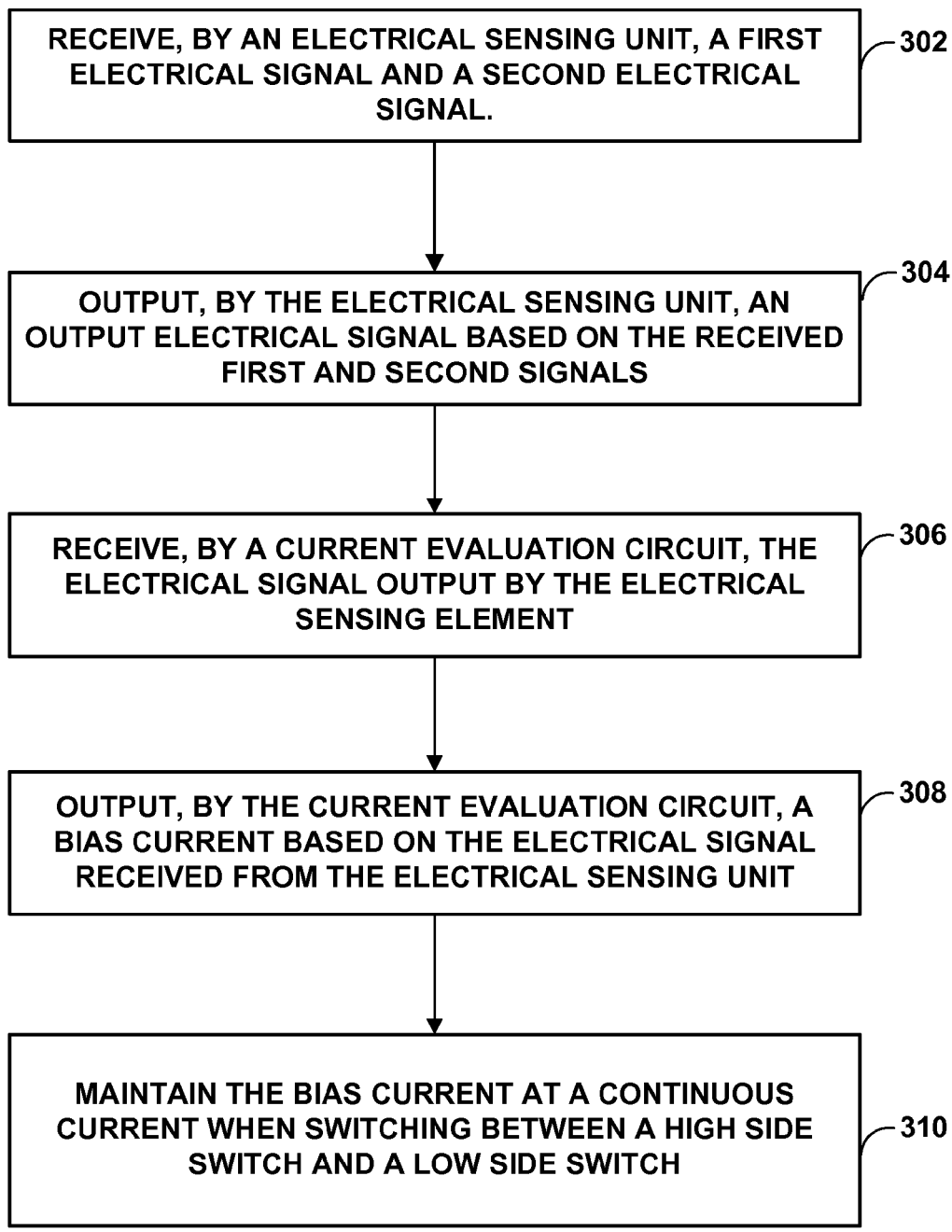
FIG. 4 is a flowchart illustrating an example method for operations of an example tracking current sense system, in accordance with one or more aspects of this disclosure.

FIG. 4 is a flowchart illustrating an example method for operations of an example tracking current sense system, in accordance with one or more aspects of this disclosure. The example method is described with reference to tracking current sense system 100 for ease of illustration only. In some examples, an electrical sensing element 24 may receive a first electrical signal and a second electrical signal from the active switch in a half-bridge 20 (302). The active switch may be the high side switch 22A during the $T_{ON}$ cycle, while the active switch may be the low side switch 22B during the $T_{OFF}$ cycle. In a non-linear system, the electrical sensing element 24 may include a comparator which may receive a first voltage from a first voltage source and a second voltage from a second voltage source. In a linear system, the electrical sensing element 24 may include an OTA which may receive a first voltage and a second voltage. The electrical sensing element 24 may output an electrical signal based on the received first and second signals (304). The output signal may include a voltage in a non-linear system while the output signal may include a current in a linear system.

In some examples, a current evaluation circuit 26 may receive the electrical signal output by the electrical sensing element (306). For example, current evaluation circuit 26 may receive a voltage from electrical sensing element 24, such that a multiplexor in the current evaluation circuit 26 may close a switch that causes a capacitor to charge. In some examples, current evaluation circuit 26 may receive a current from electrical sensing element 24, such that a capacitor may be charged. The current evaluation circuit 26 may output a bias current based on the electrical signal received from the electrical sensing unit (308). Current evaluation circuit 26 may increase or decrease the bias current in order to track the current in half-bridge 20.

Current evaluation circuit 26 may maintain a continuous bias current when half-bridge 20 switches between high side switch 22A and low side switch 22B (310). In some examples, current evaluation circuit 26 includes common circuitry for updating the bias current regardless of which switch is active. The common circuit includes a capacitor to maintain the bias current at a continuous current.

The following examples may illustrate one or more aspects of the disclosure.

EXAMPLE 1

A tracking current sensing system, comprising: a first electrical sensing element configured to receive a first electrical signal from a high side switch of a half-bridge circuit, receive a second electrical signal from the high side switch, and output an electrical signal based on the received first electrical signal and received second electrical signal; a second electrical sensing element configured to receive a first electrical signal from a low side switch of the half-bridge circuit, receive a second electrical signal from the low side switch, and output an electrical signal based on the received first electrical signal and received second electrical signal; and a current evaluation circuit electrically coupled to the first electrical sensing element and the second electrical sensing element, wherein the current evaluation circuit is configured to receive the electrical signal output by the first electrical sensing element and the second electrical sensing element, and output a bias output current that is continuous when the half-bridge switches between the high side switch and the low side switch.

EXAMPLE 2

The tracking current sensing system of example 1, wherein the current evaluation circuit comprises: a current generator configured to generate a current; and a capacitor electrically coupled to the current generator, wherein the capacitor is configured to receive the current generated by the current generator and maintain the continuous bias output current when the half-bridge switches between the high side switch and the low side switch.

EXAMPLE 3

The tracking current sensing system of examples 1-2, wherein the first electrical sensing element is configured to compare the first electrical signal from the high side switch to the second electrical signal from the high side switch and output an electrical signal based on a current in the half bridge, wherein the second electrical sensing element is configured to compare the first electrical signal from the low side switch to the second electrical signal from the low side switch and output an electrical signal based on the current in the half bridge.

EXAMPLE 4

The tracking current sensing system of examples 1-3, wherein the high side switch comprises: a first transistor configured to receive a voltage from a first source and output the first electrical signal from the high side switch; and a second transistor configured to receive a voltage from a second source and output the second electrical signal from the high side switch; wherein the low side switch comprises: a first transistor configured to receive a voltage from the first source and output the first electrical signal from the low side switch; and a second transistor configured to receive a voltage from the second source and output the second electrical signal from the low side switch.

EXAMPLE 5

The tracking current sensing system of examples 1-4, wherein the tracking current sensing system comprises a non-linear system, wherein the first electrical sensing element comprises a comparator and the second electrical sensing element comprises a comparator, wherein the electrical output from the first electrical sensing element comprises a voltage and the electrical output from the second electrical sensing element comprises a voltage.

EXAMPLE 6

The tracking current sensing system of examples 1-5, the current evaluation circuit further comprising: a switch; and a multiplexer electrically coupled to the first electrical sensing element and the second electrical sensing element, wherein the multiplexer is configured to control the switch based on the voltage output by the first electrical sensing element and the voltage output by the second electrical sensing element.

EXAMPLE 7

The tracking current sensing system of examples 1-6, wherein the tracking current sensing system comprises a linear system, wherein the first electrical sensing element comprises an operational transconductance amplifier (OTA) and the second electrical sensing element comprises an OTA, wherein the electrical output from the first electrical sensing element comprises a current and the electrical output from the second electrical sensing element comprises a current.

EXAMPLE 8

The tracking current sensing system of examples 1-7, the current evaluation circuit further comprising: a control unit; and a first switch electrically coupled to the control unit and the first electrical sensing element, such that, when the first switch is closed the bias output current is based on the current output by the first electrical sensing element; and a second switch electrically coupled to the control unit and the second sensing element, such that, when the second switch is closed the bias output current is based on the current output by the second electrical sensing element.

EXAMPLE 9

A method comprising: receiving, by a first electrical sensing element and from a high side switch of a half-bridge circuit, a first electrical signal and a second electrical signal; outputting, by the first electrical sensing element, an electrical signal based on the received first electrical signal and received second electrical signal; receiving, by a second electrical sensing element and from a low side switch of a half-bridge circuit, a first electrical signal and a second electrical signal; outputting, by the second electrical sensing element, an electrical signal based on the received first electrical signal and received second electrical signal; receiving, by a current evaluation circuit, the electrical signal output by the first electrical sensing element and the electrical signal output by the second electrical sensing element; and outputting, by the current evaluation circuit, a bias output current that is continuous when the half-bridge switches between the high side switch and the low side switch.

EXAMPLE 10

The method of example 9, further comprising: generating, by a current generator, a current; receiving, by a capacitor electrically coupled to the current generator, the current; and maintaining, by the capacitor, the continuous bias output current when the half-bridge switches between the high side switch and the low side switch.

EXAMPLE 11

The method of examples 9-10, further comprising: comparing, by the first electrical sensing element, the first electrical signal from the high side switch to the second electrical signal from the high side switch; outputting, by the first electrical sensing element, an electrical signal based on a current in the half bridge; comparing, by the second electrical sensing element, the first electrical signal from the low side switch to the second electrical signal from the low side switch; and outputting, by the second electrical sensing element, an electrical signal based on the current in the half bridge.

EXAMPLE 12

The method of examples 9-11, further comprising: receiving, by a first transistor of the high side switch, a voltage from a first source, and outputting the first electrical signal from the high side switch; receiving, by a second transistor of the high side switch, a voltage from a second source, and outputting the second electrical signal from the high side switch; receiving, by a first transistor of the low side switch, a voltage from the first source, and outputting the first electrical signal from the low side switch; and receiving, by a second transistor of the low side switch, a voltage from the second source, and outputting the second electrical signal from the low side switch.

EXAMPLE 13

The method of examples 9-12, wherein the first electrical sensing element comprises a comparator and the second electrical sensing element comprises a comparator, wherein the electrical signal output by the first electrical sensing element comprises a voltage and the electrical signal output by the second electrical sensing element comprises a voltage.

EXAMPLE 14

The method of examples 9-13, further comprising: controlling, by a multiplexer electrically coupled to the first electrical sensing element and the second electrical sensing element and based on the voltage output by the first sensing element and the voltage output by the second sensing element, a switch.

EXAMPLE 15

The method of examples 9-14, wherein the first electrical sensing element comprises an operational transconductance amplifier (OTA) and the second electrical sensing element comprises an OTA, wherein the electrical output from the first electrical sensing element comprises a current and the electrical output from the second electrical sensing element comprises a current.

EXAMPLE 16

The method of examples 9-15, wherein outputting the bias output current is based on: the current output by the first electrical sensing element when a first switch that is electrically coupled to a control unit and the first switch is closed, and the current output by the second electrical sensing element when a second switch that is electrically coupled to the control unit and the second switch is closed.

EXAMPLE 17

A system comprising: a half-bridge circuit comprising a high side switch and a low side switch; a first electrical sensing element configured to receive a first electrical signal from the high side switch, receive a second electrical signal from the high side switch, and output an electrical signal based on the received first electrical signal and received second electrical signal; a second electrical sensing element configured to receive a first electrical signal from the low side switch, receive a second electrical signal from the low side switch, and output an electrical signal based on the received first electrical signal and received second electrical signal; and a current evaluation circuit electrically coupled to the first electrical sensing element and the second electrical sensing element, wherein the current evaluation circuit is configured to receive the electrical signal output by the first electrical sensing element and the second sensing element, and output a bias output current that is continuous when the half-bridge switches between the high side switch and the low side switch.

EXAMPLE 18

The system of example 17, wherein the current evaluation circuit comprises: a current generator configured to generate a current; and a capacitor electrically coupled to the current generator, wherein the capacitor is configured to receive the current generated by the current generator and maintain the continuous bias output current when the half-bridge switches between the high side switch and the low side switch.

EXAMPLE 19

The system of examples 17-18, wherein the first electrical sensing element is configured to compare the first electrical signal from the high side switch to the second electrical signal from the high side switch and output an electrical signal based on a current in the half bridge, wherein the second electrical sensing element is configured to compare the first electrical signal from the low side switch to the second electrical signal from the low side switch and output an electrical signal based on the current in the half bridge.

EXAMPLE 20

The system of examples 17-19, wherein the high side switch comprises: a first transistor configured to receive a voltage from a first source and output the first electrical signal from the high side switch; and a second transistor configured to receive a voltage from a second source and output the second electrical signal from the high side switch; wherein the low side switch comprises: a first transistor configured to receive a voltage from the first source and output the first electrical signal from the low side switch; and a second transistor configured to receive a voltage from the second source and output the second electrical signal from the low side switch.

Various examples and techniques have been described. Aspects or features of examples described herein may be combined with any other aspect or feature described in another example. These described examples and other examples are within the scope of the following claims.

What is claimed is:

1. A tracking current sensing system comprising:
   a first electrical sensing element configured to:
      receive a first electrical signal from a high side switch of a half-bridge circuit,
      receive a second electrical signal from the high side switch, and
      output a third electrical signal based on the received first electrical signal and received second electrical signal;
   a second electrical sensing element configured to:
      receive a fourth electrical signal from a low side switch of the half-bridge circuit,
      receive a fifth electrical signal from the low side switch, and
      output a sixth electrical signal based on the received fourth electrical signal and received fifth electrical signal; and
   a current evaluation circuit electrically coupled to the first electrical sensing element and the second electrical sensing element, wherein the current evaluation circuit comprises:
      a current generator configured to generate a current; and
      a capacitor electrically coupled to the current generator,
   wherein the current evaluation circuit is configured to:
      receive the third electrical signal output by the first electrical sensing element and the sixth electrical signal output by the second electrical sensing element, and
      output a bias output current that is continuous when the half-bridge switches between the high side switch and the low side switch, and
      wherein the capacitor is configured to receive the current generated by the current generator and maintain the continuous bias output current when the half-bridge switches between the high side switch and the low side switch.

2. The tracking current sensing system of claim 1, wherein the first electrical sensing element is configured to output the third electrical signal by at least being configured to:
   compare the first electrical signal from the high side switch to the second electrical signal from the high side switch, and
   output the third electrical signal based on the comparison of the first electrical signal and the second electrical signal, wherein the first electrical signal is indicative of a current in the half bridge,
wherein the second electrical sensing element is configured to output the sixth electrical signal by at least being configured to:
   compare the fourth electrical signal from the low side switch to the fifth electrical signal from the low side switch, and
   output the sixth electrical signal based on the comparison of the fourth electrical signal and the fifth electrical signal, wherein the fourth electrical signal is indicative of the current in the half bridge.

3. The tracking current sensing system of claim 1, wherein the high side switch comprises:
   a first transistor configured output the first electrical signal at a first source of the first transistor; and
   a second transistor configured to output the second electrical signal at a second source of the second transistor;
wherein the low side switch comprises:
   a third transistor configured to output the fourth electrical signal at a third source of the third transistor; and
   a fourth transistor configured to output the fifth electrical signal at a fourth source of the fourth transistor.

4. The tracking current sensing system of claim 1, wherein the tracking current sensing system comprises a non-linear system, wherein the first electrical sensing element comprises a first comparator and the second electrical sensing element comprises a second comparator, wherein the third electrical signal output by the first electrical sensing element comprises a first voltage and the sixth electrical signal output by the second electrical sensing element comprises a second voltage.

5. The tracking current sensing system of claim 4, the current evaluation circuit further comprising:
   a switch; and
   a multiplexer electrically coupled to the first electrical sensing element and the second electrical sensing element, wherein the multiplexer is configured to control the switch based on the first voltage output by the first electrical sensing element and the second voltage output by the second electrical sensing element.

6. The tracking current sensing system of claim 1, wherein the tracking current sensing system comprises a linear system, wherein the first electrical sensing element comprises a first operational transconductance amplifier (OTA) and the second electrical sensing element comprises a second OTA, wherein the third electrical signal output by the first electrical sensing element comprises a first current and the sixth electrical signal output by the second electrical sensing element comprises a second current.

7. The tracking current sensing system of claim 6, the current evaluation circuit further comprising:
   a control unit;
   a first switch electrically coupled to the control unit and the first electrical sensing element, such that, when the first switch is closed the bias output current is based on the first current output by the first electrical sensing element; and a second switch electrically coupled to the control unit and the second sensing element, such that, when the second switch is closed the bias output current is based on the second current output by the second electrical sensing element.

8. A method comprising:

receiving, by a first electrical sensing element and from a high side switch of a half-bridge circuit, a first electrical signal and a second electrical signal;

outputting, by the first electrical sensing element, a third electrical signal based on the received first electrical signal and received second electrical signal;

receiving, by a second electrical sensing element and from a low side switch of a half-bridge circuit, a fourth electrical signal and a fifth electrical signal;

outputting, by the second electrical sensing element, a sixth electrical signal based on the received fourth electrical signal and received fifth electrical signal;

receiving, by a current evaluation circuit, the third electrical signal output by the first electrical sensing element and the sixth electrical signal output by the second electrical sensing element;

outputting, by the current evaluation circuit, a bias output current that is continuous when the half-bridge switches between the high side switch and the low side switch;

generating, by a current generator, a current;

receiving, by a capacitor electrically coupled to the current generator, the current; and maintaining, by the capacitor, the continuous bias output current when the half-bridge switches between the high side switch and the low side switch.

9. The method of claim 8, further comprising:

comparing, by the first electrical sensing element, the first electrical signal from the high side switch to the second electrical signal from the high side switch;

outputting, by the first electrical sensing element, the third electrical signal based on a comparison of the first electrical signal and the second electrical signal, wherein the first electrical signal is indicative of a current in the half bridge;

comparing, by the second electrical sensing element, the fourth electrical signal from the low side switch to the fifth electrical signal from the low side switch; and outputting, by the second electrical sensing element, the sixth electrical signal based on a comparison of the fourth electrical signal and the fifth electrical signal, wherein the fourth electrical signal is indicative of the current in the half bridge.

10. The method of claim 8, further comprising:

outputting, by a first transistor of the high side switch, the first electrical signal at a first source of the first transistor;

outputting, by a second transistor of the high side switch, the second electrical signal at a second source of the second transistor;

outputting, by a third transistor of the low side switch, the fourth electrical signal at a third source of the third transistor; and outputting, by a fourth transistor of the low side switch, the fifth electrical signal at a fourth source of the fourth transistor.

11. The method of claim 8, wherein the first electrical sensing element comprises a first comparator and the second electrical sensing element comprises second a comparator, wherein the third electrical signal output by the first electrical sensing element comprises a first voltage and the sixth electrical signal output by the second electrical sensing element comprises a second voltage.

12. The method of claim 11, further comprising:

controlling, by a multiplexer electrically coupled to the first electrical sensing element and the second electrical sensing element and based on the first voltage output by the first sensing element and the second voltage output by the second sensing element, a switch.

13. The method of claim 8, wherein the first electrical sensing element comprises a first operational transconductance amplifier (OTA) and the second electrical sensing element comprises a second OTA, wherein the third electrical signal output by the first electrical sensing element comprises a first current and the sixth electrical signal output by the second electrical sensing element comprises a second current.

14. The method of claim 13, wherein outputting the bias output current is based on:

the first current output by the first electrical sensing element when a first switch that is electrically coupled to a control unit and the first electrical sensing element is closed, and the second current output by the second electrical sensing element when a second switch that is electrically coupled to the control unit and the second electrical sensing element is closed.

15. A system comprising:

a half-bridge circuit comprising a high side switch and a low side switch;

a first electrical sensing element configured to:
  receive a first electrical signal from the high side switch,
  receive a second electrical signal from the high side switch, and
  output a third electrical signal based on the received first electrical signal and received second electrical signal;

a second electrical sensing element configured to
  receive a fourth electrical signal from the low side switch,
  receive a fifth electrical signal from the low side switch, and
  output a sixth electrical signal based on the received fourth electrical signal and received fifth electrical signal; and a current evaluation circuit electrically coupled to the first electrical sensing element and the second electrical sensing element, wherein the current evaluation circuit comprises:
  a current generator configured to generate a current; and
  a capacitor electrically coupled to the current generator,
wherein the current evaluation circuit is configured to:
  receive the third electrical signal output by the first electrical sensing element and the sixth electrical signal output by the second sensing element, and
  output a bias output current that is continuous when the half-bridge switches between the high side switch and the low side switch, and
    wherein the capacitor is configured to receive the current generated by the current generator and maintain the continuous bias output current when the half-bridge switches between the high side switch and the low side switch.

16. The system of claim 15,
wherein the first electrical sensing element is configured to output the third electrical signal by at least being configured to:
  compare the first electrical signal from the high side switch to the second electrical signal from the high side switch; and
  output the third electrical signal based on the comparison of the first electrical signal and the second electrical signal, wherein the first electrical signal is indicative of a current in the half bridge,
wherein the second electrical sensing element is configured to:
  compare the fourth electrical signal from the low side switch to the fifth electrical signal from the low side switch; and
  output the sixth electrical signal based on a comparison of the fourth electrical signal and the fifth electrical signal, wherein the fourth electrical signal is indicative of the current in the half bridge.

17. The system of claim 15,
wherein the high side switch comprises:
  a first transistor configured to output the first electrical signal at a first source of the first transistor; and
  a second transistor configured to output the second electrical signal at a second source of the second transistor;
wherein the low side switch comprises:
  a third transistor configured to output the fourth electrical signal at a third source of the third transistor; and
  a fourth transistor configured to output the fifth electrical signal at a fourth source of the fourth transistor.

18. The tracking current system of claim 1, wherein switching between the high side switch and the low side switch comprises:
  turning on the high side switch and turning off the low side switch, or
  turning off the high side switch and turning on the low side switch.

19. The method of claim 8, wherein switching between the high side switch and the low side switch comprises:
  turning on the high side switch and turning off the low side switch, or
  turning off the high side switch and turning on the low side switch.

20. The system of claim 15, wherein switching between the high side switch and the low side switch comprises:
  turning on the high side switch and turning off the low side switch, or
  turning off the high side switch and turning on the low side switch.

* * * * *